US009478420B2

(12) United States Patent
Castaldi et al.

(10) Patent No.: US 9,478,420 B2
(45) Date of Patent: Oct. 25, 2016

(54) METHOD FOR DEPOSITING A GROUP III NITRIDE SEMICONDUCTOR FILM

(71) Applicant: Oerlikon Advanced Technologies AG, Balzers (LI)

(72) Inventors: Lorenzo Castaldi, Galgenen (CH); Martin Kratzer, Feldkirch (AT); Heinz Felzer, Landquart (CH); Robert Mamazza, Jr., Buchs (CH)

(73) Assignee: EVATEC AG, Trubbach (CH)

( * ) Notice: Subject to any disclaimer, the term of this patent is extended or adjusted under 35 U.S.C. 154(b) by 129 days.

(21) Appl. No.: 14/570,161

(22) Filed: Dec. 15, 2014

(65) Prior Publication Data

US 2015/0140792 A1 May 21, 2015

Related U.S. Application Data

(63) Continuation of application No. PCT/IB2013/054878, filed on Jun. 14, 2013.

(60) Provisional application No. 61/660,004, filed on Jun. 15, 2012.

(51) Int. Cl.
*H01L 21/28* (2006.01)
*H01L 21/02* (2006.01)
(Continued)

(52) U.S. Cl.
CPC ....... *H01L 21/02658* (2013.01); *C23C 14/022* (2013.01); *C23C 14/0617* (2013.01);
(Continued)

(58) Field of Classification Search
CPC ............... H01L 21/0242; H01L 21/02458; H01L 21/0254; H01L 21/02609; H01L 21/02631; H01L 21/02658; H01L 21/02661

USPC ............................. 438/46, 602–606
See application file for complete search history.

(56) References Cited

U.S. PATENT DOCUMENTS

2011/0284863 A1* 11/2011 Lindow ............... H01L 21/0237
257/76
2013/0049065 A1 2/2013 Menard

FOREIGN PATENT DOCUMENTS

EP    2 056 339 A1    5/2009
JP    2011-144422 A   7/2011
(Continued)

OTHER PUBLICATIONS

Korean Office action for 10-2014-7034859 dated Sep. 10, 2015.
(Continued)

*Primary Examiner* — H Tsai
(74) *Attorney, Agent, or Firm* — Pearne & Gordon LLP

(57) ABSTRACT

A method for depositing a Group III nitride semiconductor film on a substrate is provided that comprises: providing a sapphire substrate; placing the substrate in a vacuum chamber; conditioning a surface of the substrate by etching and providing a conditioned surface; holding the substrate away from a substrate facing surface of a heater by a predetermined distance; heating the substrate to a temperature by using the heater whilst the substrate is held away from the substrate facing surface of the heater, and depositing a Group III nitride semiconductor film onto the conditioned surface of the substrate by a physical vapour deposition method whilst the substrate is held away from the substrate facing surface of the heater and forming an epitaxial Group III nitride semiconductor film with N-face polarity on the conditioned surface of the substrate.

22 Claims, 3 Drawing Sheets

(51) Int. Cl.
- *C23C 14/02* (2006.01)
- *C23C 14/06* (2006.01)
- *C23C 14/54* (2006.01)
- *C30B 23/06* (2006.01)
- *C30B 29/40* (2006.01)

(52) U.S. Cl.
CPC ........... *C23C14/541* (2013.01); *C30B 23/063* (2013.01); *C30B 29/403* (2013.01); *H01L 21/0242* (2013.01); *H01L 21/0254* (2013.01); *H01L 21/02458* (2013.01); *H01L 21/02609* (2013.01); *H01L 21/02631* (2013.01); *H01L 21/02661* (2013.01)

(56) References Cited

FOREIGN PATENT DOCUMENTS

| | | |
|---|---|---|
| KR | 10-2009-0048590 A | 5/2009 |
| KR | 10-2010-0082379 A | 7/2010 |

OTHER PUBLICATIONS

International Search Report for PCT/IB2013/054878 dated Oct. 8, 2013.

Takeuchi, et al., "Al- and N-polar AlN Layers Grown on C-plane Sapphire Substrates by Modified Flow-Modulation MOCVD", Journal of Crystal Growth, Elsevier, Amsterdam, NL, vol. 305, No. 2, Jul. 4, 2007, pp. 360-365.

Takeuchi, et al., "Improvment of Crystalline Quality of N-polar AlN Layers on C-plane Sapphire by Low-Pressure Flow-Modulated MOCVD", Journal of Crystal Gowth, Elsevier, Amsterdam, NL, vol. 298, Feb. 13, 2007, pp. 336-340.

Wang, et al., "Molecular Beam Epitaxy Growth of GaN, AlN and InN", Process in Crystal Growth and Characterization of Materials, Elsevier Publishing, Barking, GB, vol. 48-49, Jan. 1, 2004, pp. 42-103.

\* cited by examiner

METHOD FOR DEPOSITING A GROUP III NITRIDE SEMICONDUCTOR FILM

A method for depositing a Group III nitride semiconductor film is described herein.

Group III nitride semiconductors are used in various devices such as light emitting diodes, laser diodes, photovoltaic solar cells and power devices such as high electron mobility transistors.

The basic structure of a light emitting diode (LED) corresponds to a pn-semiconductor diode so that they exhibit comparable characteristics. A difference lies in the semiconductor materials used for LEDs. While non-luminescent diodes are manufactured from silicon, or sometimes germanium or selenium, the semiconductor material for LEDs is a III-V semiconductor, usually a gallium compound.

If a voltage is applied in a forward direction, electrons migrate from the n-doped to the p-doped side of the LED and light is emitted. The wavelength of the light emitted, and thus its color, depends on the band gap energy of the materials forming the pn-junction. In silicon or germanium diodes, the electrons and holes recombine by a non-radiative transition, which produces no optical emission, because these are indirect band gap materials. The materials used for the LED have a direct band gap with energies corresponding to near-infrared, visible, or near-ultraviolet light.

LEDs are usually built on an n-type substrate, with an electrode attached to the p-type layer deposited on its surface. P-type substrates, while less common, are used as well. Some commercial LEDs, especially GaN/InGaN, use a sapphire substrate.

The large lattice mismatch between GaN and substrates, such as sapphire, silicon, SiC and quartz, can be matched by using multiple growth steps to accommodate the lattice strain and enable the growth of high quality GaN films.

An intermediate epitaxially grown AlN layer may be deposited on the substrate and serves as a template upon which GaN can be grown, due to the smaller lattice mismatch between AlN and various substrates. Therefore, the use of an AlN buffer layer may be used to bypass the challenging nucleation steps needed for the MOCVD process to grow GaN on various substrates, such as sapphire.

Not only the quality of the epitaxy, but also the polarity of the Group III nitride film may be adjusted.

U.S. 2013/0049065 A1 discloses an epitaxial film forming method capable of fabricating a Group III polarity film made of a Group III nitride semiconductor, such as an AlN film having Al-face polarity, by sputtering. The AlN film is sputtered onto a sapphire or $\alpha$-$Al_2O_3$ substrate heated to a sputtering temperature by a heater which is disposed away from the heater by a predetermined distance.

However, further methods, with which a Group III nitride semiconductor film with a desired face polarity can be fabricated, are desirable.

A method for depositing a Group III nitride semiconductor film on a substrate is provided that comprises providing a sapphire substrate, such as a <0001> c-plane sapphire substrate, placing the substrate in a vacuum chamber, conditioning a surface of the substrate by etching and providing a conditioned surface, holding the substrate away from a substrate facing surface of a heater by a predetermined distance, heating the substrate to a temperature $T_1$ by using the heater whilst the substrate is held away from the substrate facing surface of the heater, and depositing a Group III nitride semiconductor film onto the conditioned surface of the substrate by a physical vapour deposition method whilst the substrate is held away from the substrate facing surface of the heater and forming an epitaxial Group III nitride semiconductor film with N-face polarity on the conditioned surface of the substrate.

The combination of an etching process to provide a conditioned surface and depositing a Group III nitride semiconductor film onto this conditioned surface whilst the substrate is not in direct physical contact with the heater has been found to facilitate the formation of a N-face polarity in the Group III nitride semiconductor film. One possible mechanism, by which this feature may be provided, may lie in the formation of an Al-terminated conditioned structure after the etching step which encourages the formation of a N-face polarity in a Group III nitride semiconductor film deposited onto this Al-terminated conditioned surface.

For example, for some devices, GaN films with Ga-face polarity are desirable because they exhibit a smoother surface than N-face polar layers. One way to obtain Ga-face polar GaN films is to grow an epitaxial AlN film having N-face polarity on the substrate. This AlN film with N-face polarity promotes the formation of a Ga-face polarity in a GaN film deposited on the N-face polarity AlN film.

In an embodiment, the conditioning the surface of the substrate comprises plasma soft-etching the surface under vacuum. The plasma soft-etching may comprise heating the substrate to a temperature $T_2$, introducing Ar gas into the vacuum chamber and subjecting the surface of the substrate to a plasma. The temperature $T_2$ may lie in the range of 35° C. to 70° C., for example 50° C. In an embodiment, the plasma soft-etching is carried out at a pressure of $2.10^{-4}$ mbar to $8.10^{-4}$ mbar with a RF plasma comprising $Ar^+$ ions. A RF power of 50 W may be used, for example.

The temperature $T_2$ at which the plasma soft-etching is carried out may be less than the temperature $T_1$ of the substrate at which the Group III nitride film is deposited. $T_1$ may lie in the range of 650° C. to 800° C.

In an embodiment, the substrate is held away from the substrate facing surface of the heater during the plasma soft-etching.

In an embodiment, the conditioning of the surface of the sub-strate comprises chemical etching the surface in place of, or in addition to, the plasma soft-etching of the surface.

After the etching, the conditioned surface may be Al-terminated. The etching may comprise preferentially removing chemically bound oxygen from the substrate in order to provide an Al-terminated surface on the sapphire substrate.

The method may further comprise subjecting the conditioned surface to a nitrogen flow in the vacuum chamber after the conditioning. In the case of an Al-terminated conditioned surface, the nitrogen flow may be used to encourage the growth of hexagonal AlN on the Al-terminated conditioned surface. This hexagonal AlN may be a single monolayer and may be used to encourage the growth of N-face AlN on the hexagonal AlN layer.

In an embodiment, the method further comprises flowing Argon (Ar) gas over the substrate whilst the substrate is heated up to the temperature $T_1$. This may aid in preventing the accumulation of contaminants, for example, on the conditioned surface before the AlN layer is deposited onto it.

The method of any one of the embodiments described herein may be carried out in a multiple chamber system such as a cluster tool. In this case, the conditioning may be carried out in a first vacuum chamber and the depositing of the Group III nitride film may be carried out in a second, different, vacuum chamber. The substrate may be transferred between the first and the second chambers via a transfer chamber which is also under vacuum.

After the conditioning, the method may further comprise reducing the pressure in the vacuum chamber. This may be used to clean the vacuum chamber. The pressure in the chamber may also be reduced before the conditioning and/or before the depositing to clean the vacuum chamber.

The physical vapour deposition (PVD) process may be sputter deposition, for example RF magnetron sputtering, DC sputtering or a pulsed DC sputtering.

In an embodiment, the Group III nitride semiconductor film is deposited onto the conditioned surface of the substrate by reactive sputtering. The target may comprise the Group III element, for example, the target may be an aluminium target, and the process gas may comprise nitrogen and optionally argon. The nitrogen of the process gas reacts with the aluminium removed or sputtered from the target so as to form an AlN film on the conditioned surface. In the case of reactive sputtering from an electrically conductive target, a DC power supply may be used as the power supply for the target. In an embodiment, a DC power of 1.5 kW to 3 kW is used to sputter the Group III nitride semiconductor film, such as AlN, onto the conditioned surface.

In an embodiment, the Group III nitride semiconductor film is deposited onto the conditioned surface of the substrate by RF sputtering. RF sputtering may be used if the target is non-electrically conductive. For example, the target may comprise the Group III nitride which is to be deposited onto the conditioned surface. In this embodiment, the process gas may be an inert gas such as Argon.

The Group III nitride film may be deposited by first depositing a seed layer under different conditions to the remaining portion of the film. This embodiment may be used to improve the epitaxy or adhesion of the layer to the conditioned surface. In a particular embodiment, the method further comprises depositing a seed layer on the conditioned surface in a $N_2$/Ar atmosphere, wherein a ratio of $N_2$ to Ar is greater than 3, and depositing the film onto the seed layer in a in a $N_2$/Ar atmosphere, wherein the ratio of $N_2$ to Ar is less than 3, using reactive sputtering.

After depositing the Group III nitride film, the substrate may be actively cooled. Active cooling may be used to assist in reducing thermal stress on the substrate whilst the substrate cools down.

In an embodiment, the method further comprises sputtering a further Group III nitride semiconductor film onto the epitaxial Group III nitride semiconductor film, the further Group III nitride semiconductor film having Group III-face polarity. For example, if the Group III nitride film is AlN and the further Group III nitride film is GaN, the AlN film has N-face polarity and the GaN film has Ga-face polarity.

Embodiments will now be described with reference to the drawings.

One exemplary method for manufacturing a N-polar epitaxially grown AlN film on a sapphire substrate comprises: plasma soft-etching at least one surface of the sapphire substrate in a vacuum environment. Optionally, after the plasma soft-etching, the cleaned substrate surface may be exposed to nitrogen gas. A N-polar epitaxially grown AlN film is plasma deposited, for example by sputtering, in an atmosphere of nitrogen and argon while keeping the substrate at a temperature above 650° C.

Figure 1:
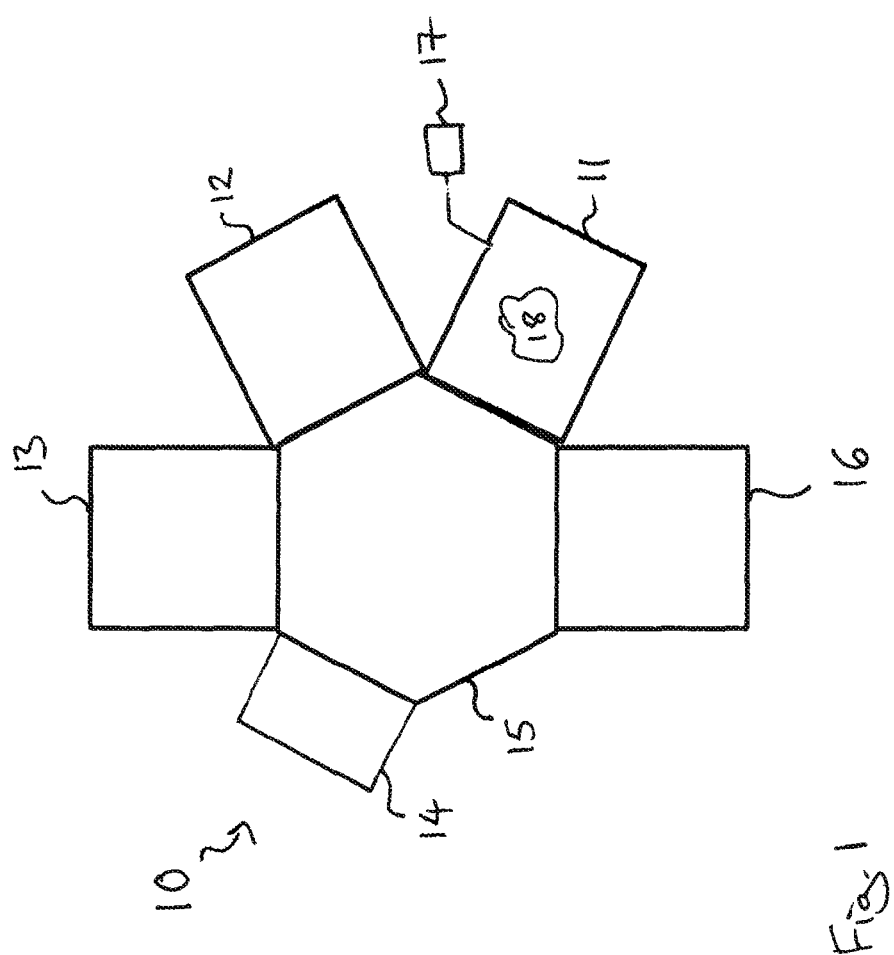
FIG. 1 illustrates a schematic diagram of a semiconductor manufacturing tool comprising several independent process stations.

The methods described herein may be performed in a semiconductor manufacturing tool comprising several independent process stations attached to a common transfer module. FIG. 1 illustrates a schematic diagram of a suitable semiconductor manufacturing tool 10 with four independent process stations 11, 12, 13, 14, a common transfer module 15 and a load lock 16 providing an interface to the ambient. Such a transfer module 15 is an enclosure preferably under vacuum conditions comprising a handling system capable to transfer substrates between the evaluable load lock 16 and the process stations 11, 12, 13, 14. The process stations 11, 12, 13, 14 may have valves allowing them to be isolated from the common transfer module 16 to avoid cross contamination. Such an arrangement of process stations 11, 12, 13, 14 and the common transfer module 15 and the load lock(s) 16 is known in the art as cluster tool. The process chambers 11, 12, 13, 14 may be equipped according to the process to be performed and may include provide for various treatments for substrates such as cleaning, heating, irradiating, depositing, etching and the like.

One of the process stations 11 is used for conditioning the sapphire substrate and a further process station 12 is used to deposit a Group III nitride semiconductor film by reactive sputtering onto the conditioned surface.

The process station 11 comprises a RF power supply 17 for producing a RF plasma 18 comprising Ar+ ions which are used to plasma soft-etch the sapphire substrate and produce a conditioned surface which may be Al-terminated.

To condition the surface of the substrate, the substrate is placed in the process station 11, the vacuum chamber pumped down and the temperature of the substrate raised to around 50° C., for example. An argon gas flow is introduced and the RF power supply switched on to produce a plasma at the surface of the substrate which is used to plasma soft-etch the surface of the substrate and produce a conditioned surface which is Al-terminated. The substrate is then transferred to the process station 12.

Figure 2:
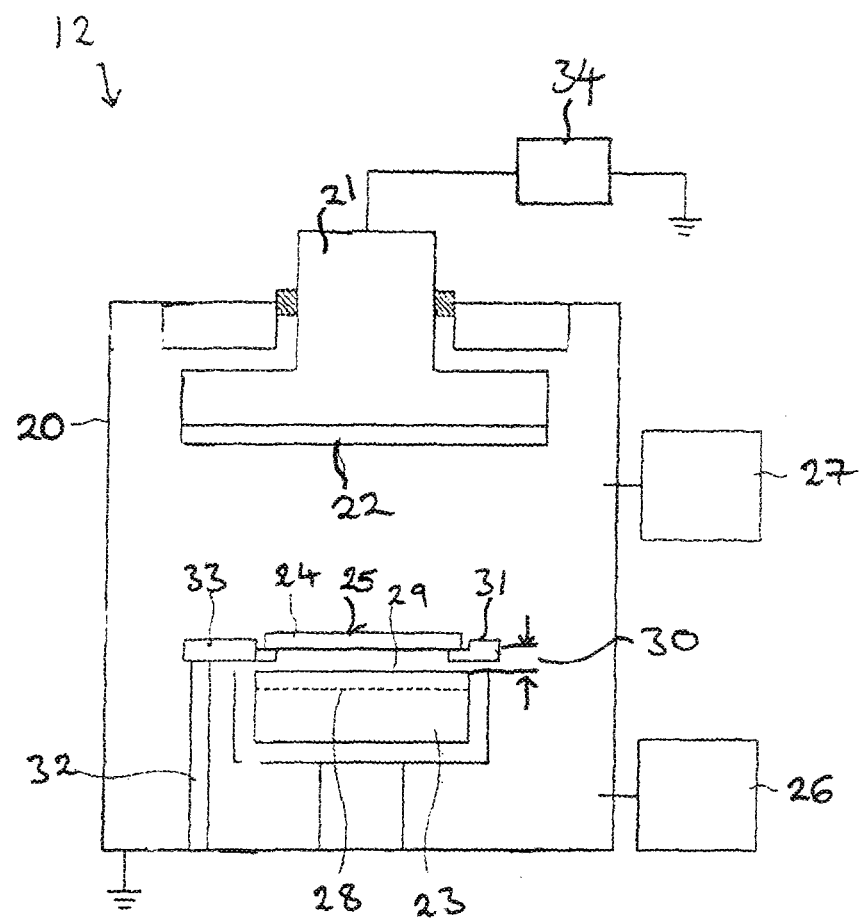
FIG. 2 illustrates apparatus for depositing a Group III nitride semiconductor film on a substrate.

The process station 12 comprises a target, for example an aluminium target, and a power supply for the aluminium target so as to enable the Group III nitride film to be deposited using reactive sputtering. FIG. 2 illustrates the process station 12 in more detail.

The process station 12 includes a vacuum chamber 20, a target holder 21 supporting a target 22 of aluminium and a heater 23 which is positioned below a substrate 24 with a conditioned surface 25. The process station 12 further comprises nitrogen gas source 26 and an argon gas source 27 from which the process gases may be allowed to flow into the vacuum chamber 20.

The heater 23 includes a heater element 28 and a substrate facing surface 29 which is spaced at a predetermined distance 30 from the rear side 31 of the substrate 24. The substrate 24 is held at the predetermined distance 30 by means of a height adjustable substrate holder 32 having a ring 33 which is used to support the periphery of the rear side 31 of the substrate 24. The substrate 24 is positioned directly opposing the target 22. The target 22 is coupled to a DC power supply 34.

To deposit aluminium nitride film onto the substrate 24, the vacuum chamber 20 is pumped out, the substrate 24 is heated to a process temperature such as 700° C. by the heater 23 whilst the substrate 24 is spaced at a distance from the substrate facing surface 29 of heater 23. Once the substrate 24 has reached the process temperature, the nitrogen and argon process gases are allowed to flow into the vacuum chamber 20 and the DC power supply is applied to the target 22 so that aluminium is sputtered from the target 22, reacts with the nitrogen process gas to form an aluminium nitride layer on the conditioned surface 25 of the substrate 24.

Figures 3A, 3B:
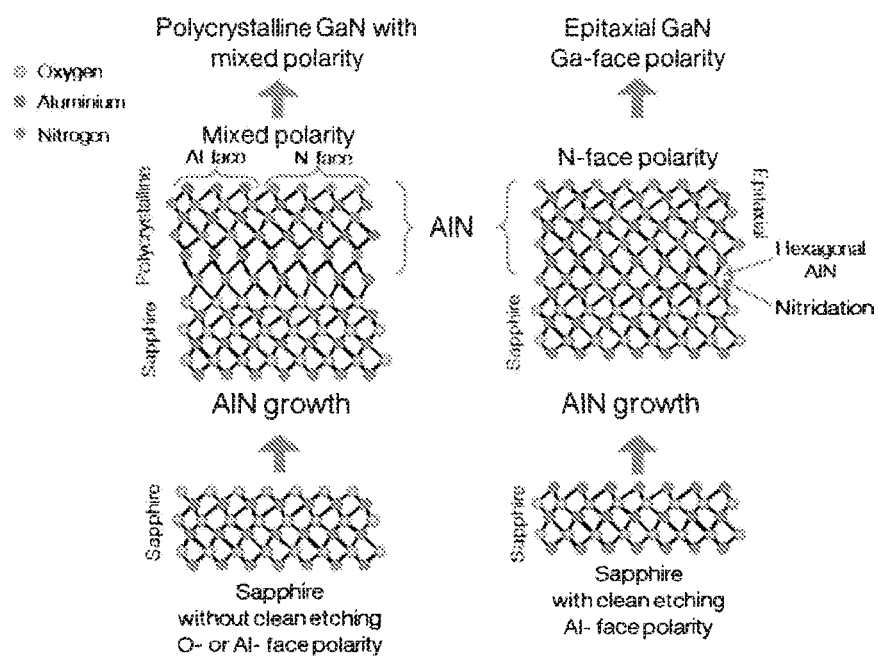
FIGS. 3a and 3b illustrate a schematic diagram of the growth of an AlN film on a sapphire substrate using a method as described herein and a comparison method.

FIG. 3a schematically illustrates the growth of AlN by magnetrop sputtering without plasma cleaning before the growth of AlN and illustrates the result of a comparison method. The sapphire substrate exhibits O-face and Al-face or mixed polarities. This structural and morphological scenario leads to the formation of a polycrystalline AlN film, and subsequently a GaN film, with mixed polarities, i.e. mixed Ga-face and N-face.

FIG. 3b schematically illustrates the growth of an AlN film on a sapphire substrate conditioned by plasma soft-etching. The ion bombardment which occurs during Ar plasma soft-etching, may promote a preferential removal of oxygen atoms, thus favouring the uncovering of Al atoms on the top surface of the substrate. In other words, plasma etching leads to the formation of Al-terminated sapphire wafers. A subsequent nitridation, resulting from $N_2$ exposure at high temperatures and a nitrogen-rich plasma used for the growth of AlN films may be used to form a transitional epitaxial AlN monolayer with an hexagonal structure between the sapphire and the AlN film and to grow an epitaxial AlN film with an N-face polarity.

This N-face AlN film promotes the formation of Ga-face polar GaN films, which exhibit smoother surfaces and result in better quality structures for LED or power device applications such as high electron mobility transistors.

One exemplary method comprises the single-substrate-treatment of a 6 inch sapphire substrate in an individual treatment chamber. The sapphire substrate is introduced into a semiconductor manufacturing tool and transferred to a processing station configured to perform an etching step. The process environment is pumped down to remove unwanted gases and remains of earlier process steps, for example for 10 s, and in parallel the temperature of substrate is adjusted to a temperature $T_2$ which may be about 50° C., for example. Ar gas is introduced, and the pressure and gas flow allowed to stabilize, for example at a chamber pressure of $5 \times 10^{-4}$ mbar. A substrate surface is soft-etched with Ar ions of the RF plasma. Conditions of about 50 W for 10 s-30 s may be used. Optionally, after soft-etching the conditioned surface may be exposed to nitrogen ($N_2$), for example with a flow of 20 sccm for about 20 s. Optionally, the chamber may be pumped down to clean from used gases before removal of the substrate from etch process station.

The substrate having a surface conditioned by soft-etching is transferred to a processing station configured to perform an AlN deposition step. The process chamber may be a PVD/sputtering chamber equipped with an Al target (300 mm diameter) and a pulsed DC power supply. The process environment is pumped down to remove unwanted gases and remains of earlier process steps, for example for 10 s. The substrate is heated up to a temperature $T_1$, which may be in the range of 650-800° C., for example 770° C. The duration of heat up depends on the heater power and time to stabilize the substrate temperature, and may be 100-600 s. Optionally, an Ar gas flow, for example 15 sccm, can be used during heat up. The process gas(es) (Ar and $N_2$) are introduced and, allowed to stabilize, for example for about 10 s. An AlN layer is deposited while controlling flow of $N_2$ and Ar. The flow of $N_2$ may 60 sccm and the flow of Ar may be 20 sccm. Sputtering may be carried out using DC power of, for example, 2.5 kW for 270 s which may be sufficient for a layer with a thickness of 100 nm. The deposition rate is, therefore, about 0.3 nm/s in this embodiment.

Optionally, a seed layer may be deposited before deposition of the AlN layer. The seed layer have be deposited with an increased $N_2$/Ar ratio, for example $N_2/Ar \gg 3$, possibly with Ar=0. Optionally, the process chamber may be pump cleaned from process gas remains. The substrate is allowed to cool, over a time period of 10-300 s for example, to avoid excessive thermal stress for substrate, limitations of handling equipment and the processed substrate is removed from semiconductor manufacturing tool.

Optionally, active cooling before removing the substrate from the processing environment, e.g. in a cooling station, may be performed. The temperature decrease may be adjusted to avoid excessive thermal stress on substrate.

The handling and transfer steps may be executed in other or varying ways. Further, heat up and cool down times are in part dependent on the hardware utilized. They may, depending on respective capabilities, allow for different heat up and cool down times without deviating from the underlying substrate treatment and deposition process.

The deposition of the AlN layer may be performed with a variation of the RF power.

Some nitridation methods utilize MOCVD and MBE deposition systems, which require the use of nitrogen plasma etching or ammonia exposure at very high temperatures, which are often not suitable for magnetron sputtering. However, nitrogen plasma etching may promote the incorporation of nitrogen by ion bombardment within the substrate, for example within the sapphire structure in the case of a sapphire structure, and/or the formation of an amorphous oxynitride. One limitation of nitridation by ammonia for magnetron sputtering may be that it would complicate the deposition process due to an additional step.

The use of $N_2$ rich gas and plasma exposure at high temperatures after Ar plasma cleaning simplifies the nitridation process by utilizing the same gas required for the growth of AlN by reactive magnetron sputtering.

The invention claimed is:

1. A method for depositing a Group III nitride semiconductor film on a substrate, comprising:
   providing a sapphire substrate;
   placing the substrate in a vacuum chamber;
   conditioning a surface of the substrate by etching and providing a conditioned surface;
   holding the substrate away from a substrate facing surface of a heater by a predetermined distance;
   heating the substrate to a temperature $T_1$ by using the heater whilst the substrate is held away from the substrate facing surface of the heater;
   depositing a Group III nitride semiconductor film onto the conditioned surface of the substrate by a physical vapour deposition method whilst the substrate is held away from the substrate facing surface of the heater and forming an epitaxial Group III nitride semiconductor film with N-face polarity on the conditioned surface of the substrate.

2. The method according to claim 1, wherein the conditioning the surface of the substrate comprises plasma soft-etching the surface under vacuum.

3. The method according to claim 2, wherein the plasma soft-etching comprises heating the substrate to a temperature $T_2$, introducing Ar gas into the vacuum chamber and subjecting the surface of the substrate to a plasma.

4. The method according to claim 3, wherein $T_2$ is 35° C. to 70° C.

5. The method according to claim 1, wherein the plasma soft-etching is carried out at a pressure of $2 \cdot 10^{-4}$ mbar to $8 \cdot 10^{-4}$ mbar with a RF plasma comprising $Ar^+$ ions.

6. The method according to claim 2, wherein $T_2 < T_1$.

7. The method according to claim 2, wherein during the plasma soft-etching the substrate is held away from the substrate facing surface of the heater.

8. The method according to claim 1, wherein the conditioning the surface of the substrate comprises chemical etching the surface.

9. The method according to claim 1, wherein the etching comprises preferentially removing chemically bound oxygen from the substrate.

10. The method according to claim 1, wherein after the etching the conditioned surface is Al-terminated.

11. The method according to claim 1, further comprising subjecting the conditioned surface to a nitrogen flow in the vacuum chamber after the conditioning.

12. The method according to claim 1, wherein $T_1$ lies in the range 650° C. to 800° C.

13. The method according to claim 1, further comprising flowing Argon gas over the substrate whilst the substrate is heated up to the temperature $T_1$.

14. The method according to claim 1, wherein the conditioning is carried out in a first vacuum chamber and the depositing is carried out in a second vacuum chamber.

15. The method according to claim 1, further comprising reducing the pressure in the vacuum chamber after the conditioning.

16. The method according to claim 1, wherein the Group III nitride semiconductor film is deposited onto the conditioned surface of the substrate by reactive sputtering.

17. The method according to claim 16, wherein a DC power of 1.5 to 3 kW is used to sputter the Group III nitride semi-conductor film onto the conditioned surface.

18. The method according to claim 1, wherein the Group III nitride semiconductor film is deposited onto the conditioned surface of the substrate by RF sputtering.

19. The method according to claim 1, further comprising depositing a seed layer on the conditioned surface in a $N_2$/Ar atmosphere, wherein a ratio of $N_2$ to Ar is greater than 3, and depositing the film onto the seed layer in a in a $N_2$/Ar atmosphere, wherein the ratio of $N_2$ to Ar is less than 3.

20. The method according to claim 1, further comprising actively cooling the substrate after depositing the Group III nitride film.

21. The method according to claim 1, wherein the Group III nitride film is AlN.

22. The method according to claim 1, further comprising sputtering a further Group III nitride semiconductor film onto the epitaxial Group III nitride semiconductor film, the further Group III nitride semiconductor film having Group III-face polarity.

* * * * *